(12) United States Patent
Liu et al.

(10) Patent No.: US 9,466,597 B2
(45) Date of Patent: Oct. 11, 2016

(54) CHIP PACKAGE STRUCTURE AND CHIP PACKAGING METHOD

(71) Applicant: Huawei Technologies Co., Ltd., Shenzhen, Guangdong (CN)

(72) Inventors: Weifeng Liu, Shenzhen (CN); Li Ding, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/457,935

(22) Filed: Aug. 12, 2014

(65) Prior Publication Data

US 2014/0346661 A1 Nov. 27, 2014

Related U.S. Application Data

(63) Continuation of application No. PCT/CN2013/081054, filed on Aug. 8, 2013.

(30) Foreign Application Priority Data

Jan. 31, 2013 (CN) .......................... 2013 1 0039004

(51) Int. Cl.
| | |
|---|---|
| *H01L 27/02* | (2006.01) |
| *H01L 21/48* | (2006.01) |
| *H01L 23/00* | (2006.01) |
| *H01L 23/36* | (2006.01) |
| *H01L 23/367* | (2006.01) |
| *H01L 23/42* | (2006.01) |
| *H01L 25/18* | (2006.01) |

(52) U.S. Cl.
CPC ....... *H01L 27/0248* (2013.01); *H01L 21/4882*
(2013.01); *H01L 23/36* (2013.01); ***H01L
23/3675* (2013.01); *H01L 23/42*** (2013.01);
*H01L 24/32* (2013.01); *H01L 25/18* (2013.01);
*H01L 2924/16152* (2013.01)

(58) Field of Classification Search
CPC ....................... H01L 27/0248; H01L 21/4882
USPC .......................................... 257/713; 438/122
See application file for complete search history.

(56) References Cited

U.S. PATENT DOCUMENTS

| | | | |
|---|---|---|---|
| 5,587,882 A | 12/1996 | Patel | |
| 7,598,958 B1 * | 10/2009 | Kelleher | ........................ 345/504 |
| 2005/0068739 A1 * | 3/2005 | Arvelo et al. | ................. 361/718 |

(Continued)

FOREIGN PATENT DOCUMENTS

| | | |
|---|---|---|
| CN | 101110397 A | 1/2008 |
| CN | 101276795 A | 10/2008 |

(Continued)

*Primary Examiner* — Christine Enad (57) ABSTRACT

Embodiments of the present invention provide a chip package structure and a chip packaging method, which is related to the field of electronic technologies, and can protect chips and effectively dissipate heat for chips. The chip package structure includes a substrate, chips, and a heat dissipating lid, where the chips include at least one master chip disposed on the substrate and at least one slave chip disposed on the substrate; the heat dissipating lid is bonded to the slave chip by using a heat conducting material, and the heat dissipating lid covers the at least one slave chip; and the heat dissipating lid includes a heat dissipating window at a position corresponding to the at least one master chip. The embodiments of the present invention are applicable to multi-chip packaging.

12 Claims, 6 Drawing Sheets

(56) References Cited

U.S. PATENT DOCUMENTS

| | | |
|---|---|---|
| 2005/0255646 A1 | 11/2005 | Cheng et al. |
| 2006/0126309 A1* | 6/2006 | Bolle .................. H05K 9/0033 361/719 |
| 2008/0211088 A1 | 9/2008 | Sato |
| 2008/0296755 A1 | 12/2008 | So et al. |
| 2013/0043581 A1* | 2/2013 | Negoro ........................ 257/712 |
| 2015/0035135 A1* | 2/2015 | Hung .................. H01L 23/3672 257/712 |
| 2015/0145141 A1* | 5/2015 | Uzoh .................. H01L 23/5384 257/774 |
| 2015/0255429 A1* | 9/2015 | Katkar ................ H01L 25/0657 257/712 |
| 2015/0380387 A1* | 12/2015 | Ben Jamaa ......... H01L 25/0657 257/713 |

FOREIGN PATENT DOCUMENTS

| | | |
|---|---|---|
| CN | 101379612 A | 3/2009 |
| CN | 102956584 A | 3/2013 |
| CN | 103117275 A | 5/2013 |
| EP | 0 694 968 A2 | 1/1996 |
| JP | 2012028484 A | 2/2012 |

* cited by examiner

| Coat a layer of heat conducting material on at least one slave chip of a substrate, and bond a heat dissipating lid to the heat conducting material | 101 |

CHIP PACKAGE STRUCTURE AND CHIP PACKAGING METHOD

CROSS-REFERENCE TO RELATED APPLICATIONS

This application is a continuation of International Application No. PCT/CN2013/081054, filed on Aug. 8, 2013, which claims priority to Chinese Patent Application No. 201310039004.6, filed on Jan. 31, 2013, both of which are hereby incorporated by reference in their entireties.

TECHNICAL FIELD

The present invention relates to the field of electronic technologies, and in particular, to a chip package structure and a chip packaging method.

BACKGROUND

Nowadays, chip heat dissipation has become one of the bottlenecks in chip design. For chip heat dissipation, in addition to using hardware (a heat sink) to achieve heat dissipation of a chip, the design of the chip also has a significant effect on heat dissipation. For the heat generated by the chip itself, a small part of the heat is dissipated out from a bottom substrate and welding joints, and most of the heat is dissipated from a surface of the chip. Therefore, currently, a heat dissipating lid is usually added on top of the chip in a chip package design. This kind of heat dissipating lid usually has two designs: one is bonding the heat dissipating lid to the chip and the substrate by using a heat conducting material to form a sealed package structure; and the other is directly bonding the heat dissipating lid to the chip by using a heat conducting material without contacting the substrate. Further, in addition to adding a heat dissipating lid on top of the chip to dissipate heat for the chip, the chip may also be directly exposed to the outside, with a heat sink directly contacting the chip by using the heat conducting material to dissipate heat.

However, in multi-chip package design, because chips include both master chips and slave chips, different functions of the chips result in different corresponding power consumption. Because a master chip is mainly a logic operation chip with high power consumption, it requires relatively high heat dissipation performance. A slave chip, however, is generally a memory chip with low power consumption, and accordingly requires relatively low heat dissipation performance. Therefore, a chip package structure with a heat dissipating lid cannot dissipate heat for a chip efficiently, while a chip in a chip package structure without a heat dissipating lid is exposed to a high risk of cracking, and the chip easily cracks.

SUMMARY

Embodiments of the present invention provide a chip package structure and a chip packaging method, which can protect chips and effectively dissipate heat for chips.

In order to achieve the above objective, the following technical solutions are adopted in the embodiments of the present invention.

According to a first aspect, a chip package structure is provided, including a substrate, chips, and a heat dissipating lid, where the chips include at least one master chip disposed on the substrate and at least one slave chip disposed on the substrate; and the heat dissipating lid is bonded to the slave chip by using a heat conducting material, and the heat dissipating lid covers the at least one slave chip; and the heat dissipating lid includes a heat dissipating window at a position corresponding to the at least one master chip.

In a first possible implementation manner, according to the first aspect, the chip package structure further includes a heat sink, where the heat sink is bonded to the at least one master chip by using a heat conducting material on each master chip at the heat dissipating window, and is bonded to the heat dissipating lid by using a heat conducting material on the heat dissipating lid.

In a second possible implementation manner, according to the first aspect, the heat dissipating lid includes a first packaging strip that is located at edges of a periphery of the heat dissipating lid and disposed on the substrate side, where the first packaging strip is bonded to the substrate by using a bonding material.

In a third possible implementation manner, according to the second possible implementation manner, the heat dissipating lid further includes:

a second packaging strip that is located on a periphery of the at least one master chip and disposed on the substrate side, where the second packaging strip is bonded to the substrate by using a bonding material.

In a fourth possible implementation manner, with reference to the first aspect, or the first possible implementation manner, or the second possible implementation manner, or the third possible implementation manner, the heat sink further includes: a boss structure located inside a heat dissipating window corresponding to a position of each master chip, and each of the boss structures is bonded to the corresponding master chip by using a heat conducting material on each master chip.

In a fifth possible implementation manner, with reference to the first aspect, or the first possible implementation manner, or the second possible implementation manner, or the third possible implementation manner, the chip package structure further includes a heat transfer sheet that is located at a heat dissipating window between the heat sink and each master chip. Each transfer sheet is bonded to the heat sink by using a heat conducting material between the heat transfer sheet and the heat sink, and each transfer sheet is bonded to the corresponding master chip by using a heat conducting material between the heat transfer sheet and the corresponding master chip.

In a sixth possible implementation manner, with reference to the first aspect, or the first possible implementation manner, or the second possible implementation manner, or the third possible implementation manner, or the fourth possible implementation manner, or the fifth possible implementation manner, an area of the heat dissipating window is greater than or equal to an upper surface area of the corresponding master chip.

In a seventh possible implementation manner, according to the sixth possible implementation manner, the heat conducting material is a heat-dissipation interface material.

According to a second aspect, a chip packaging method is provided, including:

coating a layer of heat conducting material on at least one slave chip of a substrate, and bonding a heat dissipating lid to the at least one slave chip.

In a first possible implementation manner, according to the second aspect, the packaging method further includes:

coating a layer of heat conducting material on the heat dissipating lid and at least one master chip of the substrate, bonding the heat sink to the at least one master chip of the substrate, and bonding the heat sink to the heat dissipating lid.

In a second possible implementation manner, according to the second aspect, if the heat dissipating lid includes a first packaging strip that is located at edges of a periphery of the heat dissipating lid and disposed on the substrate side, the packaging method further includes:

coating a layer of bonding material on the substrate at a position corresponding to the first packaging strip, and bonding the first packaging strip of the heat dissipating lid to the substrate.

In a third possible implementation manner, according to the second possible implementation manner, if the heat dissipating lid further includes a second packaging strip that is located on a periphery of the at least one master chip and disposed on the substrate side, the packaging method further includes:

coating a layer of bonding material on the substrate at a position corresponding to the second packaging strip, and bonding the second packaging strip of the heat dissipating lid to the substrate.

In a fourth possible implementation manner, with reference to the second aspect, or the first possible implementation manner, or the second possible implementation manner, or the third possible implementation manner, if a chip package structure further includes a heat transfer sheet that is located at a heat dissipating window between the heat sink and each master chip, the packaging method further includes:

coating a layer of heat conducting material on each master chip of the substrate, and bonding the heat transfer sheet to each master chip; and coating a layer of heat conducting material on each transfer sheet, and bonding the heat sink to each transfer sheet.

In the chip package structure and the packaging method provided in the embodiments of the present invention, a heat dissipating lid is bonded to a slave chip by using a heat conducting material, a heat dissipating window is opened on the heat dissipating lid at a position corresponding to each master chip, and a heat sink is bonded to the master chip by using a heat conducting material on each master chip at the heat dissipating window and is bonded to the heat dissipating lid by using a heat conducting material on the heat dissipating lid, thereby protecting the chips and effectively dissipating heat for the chips.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

FIG. 2b is a schematic diagram of an MM' cross-section structure of the chip package structure during a packaging process illustrated in FIG. 2a;

FIG. 3b is a schematic diagram of an SS' cross-section structure of the chip package structure during a packaging process illustrated in FIG. 3a;

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
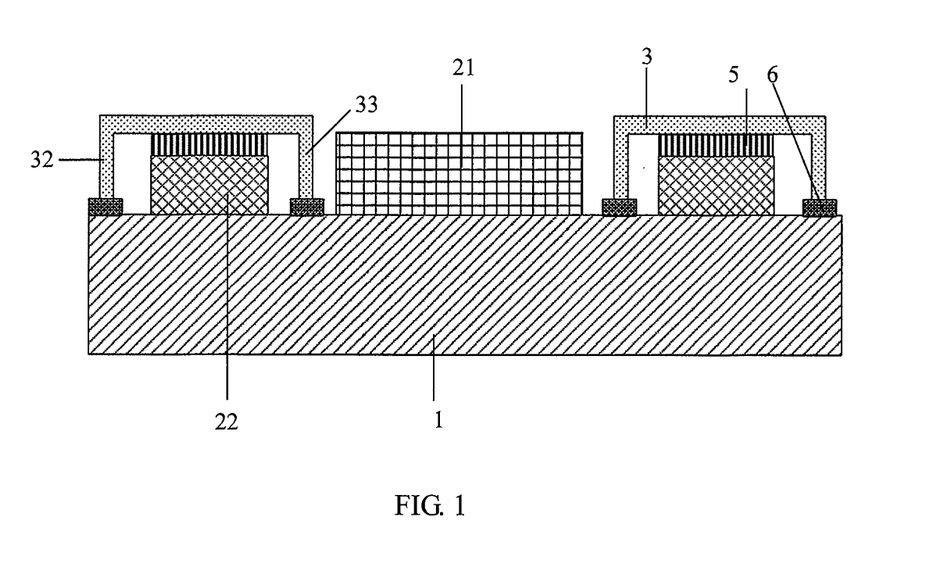
FIG. 1 is a schematic diagram of a cross-section structure of a chip package structure according to an embodiment of the present invention.
Figure 2A:
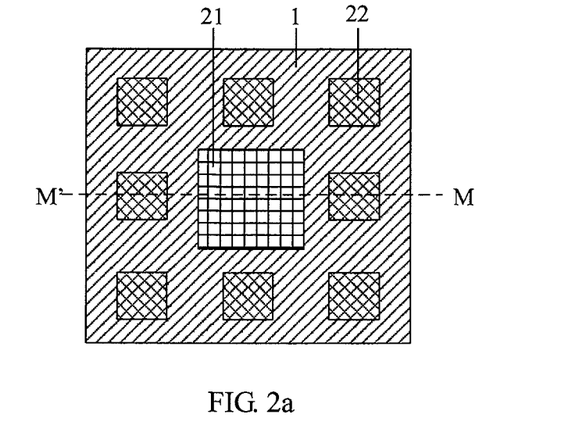
FIG. 2a is a schematic structural diagram of a top view of a chip package structure during a packaging process according to an embodiment of the present invention.
Figure 2B:
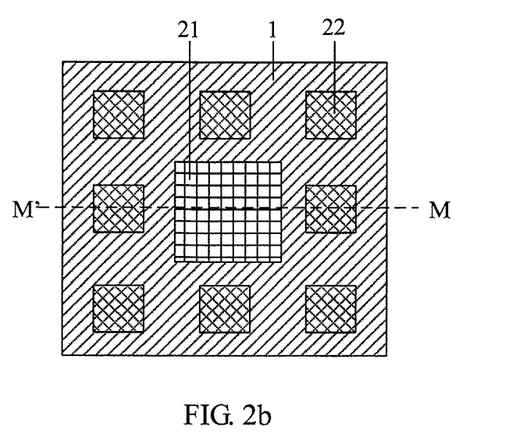
Figure 3A:
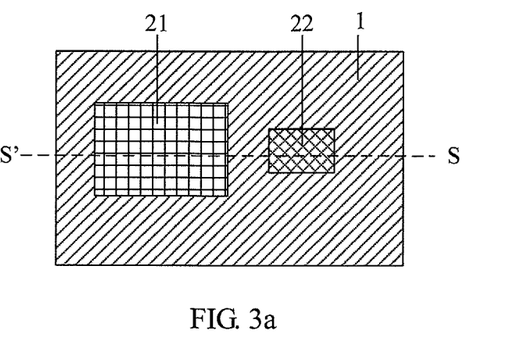
FIG. 3a is schematic structural diagram of another chip package structure during a packaging process according to an embodiment of the present invention.
Figure 3B:
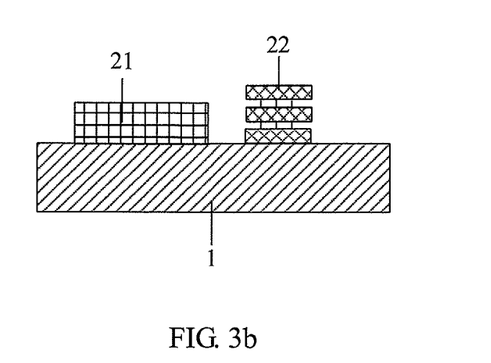
Figure 4:
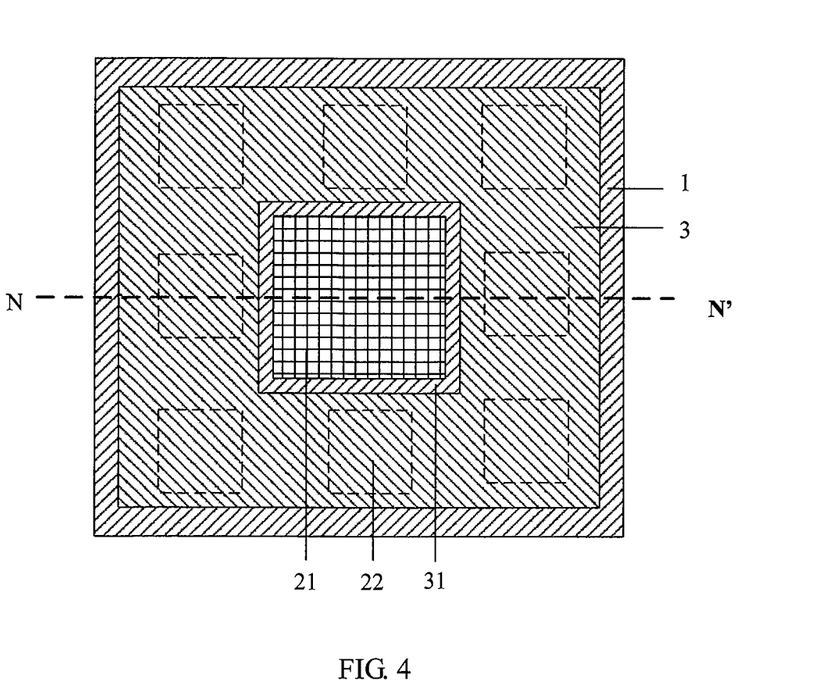
FIG. 4 is a schematic structural diagram of a top view of a chip package structure during a packaging process according to an embodiment of the present invention.
Figure 5:
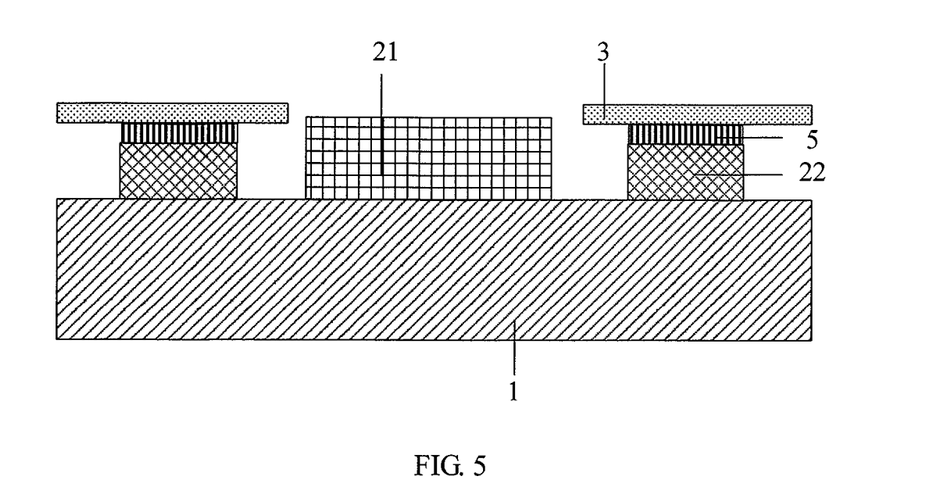
FIG. 5 is a schematic structural diagram of a cross section of a heat dissipating lid structure according to an embodiment of the present invention.
Figure 6:
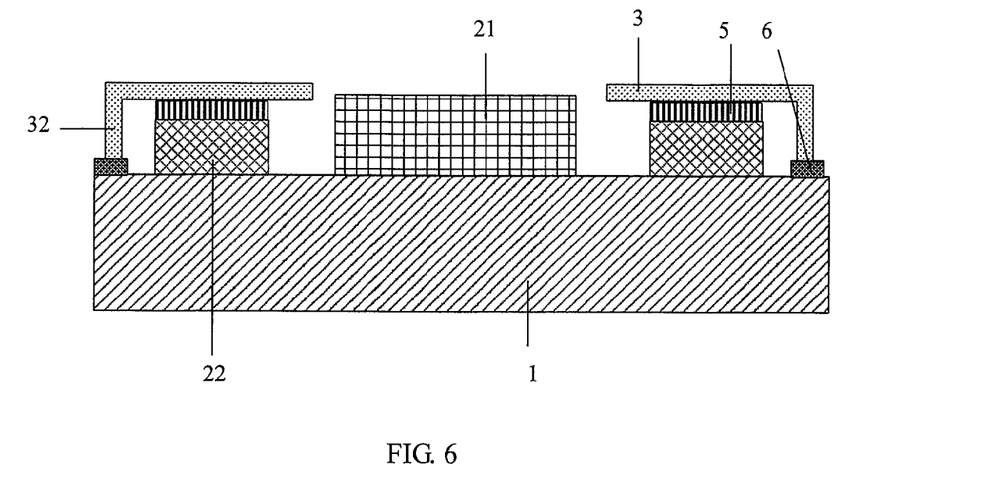
FIG. 6 is a schematic structural diagram of a cross section of another heat dissipating lid structure according to an embodiment of the present invention.

In existing multi-chip package designs, such as system in a package (System In a Package, SIP for short), multiple chips or components required by an electronic system are generally integrated in one package. In a typical multi-chip SIP structure, at least one slave chip is distributed around a master chip. For these chips, different functions result in different corresponding power consumption. Because a master chip is mainly a logic operation chip with high power consumption, it requires relatively high heat dissipation performance. A slave chip, however, is generally a memory chip with low power consumption, and therefore requires relatively low heat dissipation performance. Therefore, an existing design with a heat dissipating lid on the chip is not suitable for the chip package structure. The embodiments of the present invention provide a chip package structure, where a heat dissipating lid has different designs according to different chips. As shown in FIG. 1, a chip package structure provided by the present invention includes a substrate 1, chips 2 and a heat dissipating lid 3.

The chips 2 include at least one master chip 21 disposed on the substrate and at least one slave chip 22 disposed on the substrate.

As shown in FIGS. 2a, 2b, 3a, and 3b, the chips 2 are placed on the substrate in two structures: symmetrical structure and asymmetrical structure. In the symmetrical structure, the master chip 21 is generally placed in a central position of the substrate 1, and other slave chips 22 are laid flat around the master chip 21. In the asymmetrical structure, the substrate 1 generally has only one master chip 21 and one slave chip 22, and the slave chip 22 is memory chips stacked together by using a TSV (Through Silicon Via) technology. With memory chips stacked together, this structure has less power consumption, but correspondingly, is more fragile, and needs corresponding protection from a heat dissipating lid.

The heat dissipating lid 3 is bonded to a slave chip 22 by using a heat conducting material 5. The heat dissipating lid 3 covers at least one slave chip 22. The heat dissipating lid 3 includes a heat dissipating window 31 at a position corresponding to the at least one master chip 22 (that is, heat dissipating windows 31 may be opened on the heat dissipating lid 3 at positions corresponding to all master chips 22, or heat dissipating windows 31 may be opened on the heat dissipating lid 3 selectively at positions corresponding to one or more master chips 22).

Optionally, an area of the heat dissipating window 31 is greater than or equal to an upper surface area of the corresponding master chip 21. In this way, heat dissipating windows 31 are opened on the heat dissipating lid 3, so that the heat dissipation efficiency of the master chip 21 with high power consumption can be effectively improved, and the slave chip 22 with low power consumption is protected from cracking.

Further optionally, the heat dissipating lid 3 includes a first packaging strip 32 that is located at edges of a periphery of the heat dissipating lid 3 and disposed on the substrate 1 side, and the first packaging strip 32 is bonded to the substrate 1 by using a bonding material 6.

Further, optionally, the heat dissipating lid 3 further includes a second packaging strip 33 that is located on a periphery of the at least one master chip 21 and disposed on the substrate 1 side, and the second packaging strip 33 is bonded to the substrate 1 by using the bonding material 6.

Specifically, as shown in FIGS. 1, 4, 5, and 6, the heat dissipating lid 3 has the following three structures: first, a heat dissipating lid structure directly added to an upper surface of the slave chip 22 by using the heat conducting material 5; second, a heat dissipating lid structure directly added to the upper surface of the slave chip 22 by using the heat conducting material 5 and formed by the heat dissipating lid 3 and the first packaging strip 32 that is located at edges of the periphery of the heat dissipating lid 3 and disposed on the substrate 1 side; and third, a heat dissipating lid structure directly added to the upper surface of the slave chip 22 by using the heat conducting material 5 and formed by the heat dissipating lid 3, the first packaging strip 32 that is located at edges of the periphery of the heat dissipating lid 3 and disposed on the substrate 1 side, and the second packaging strip 33 that is located on the periphery of at least one master chip 21 and disposed on the substrate 1 side.

Figure 7:
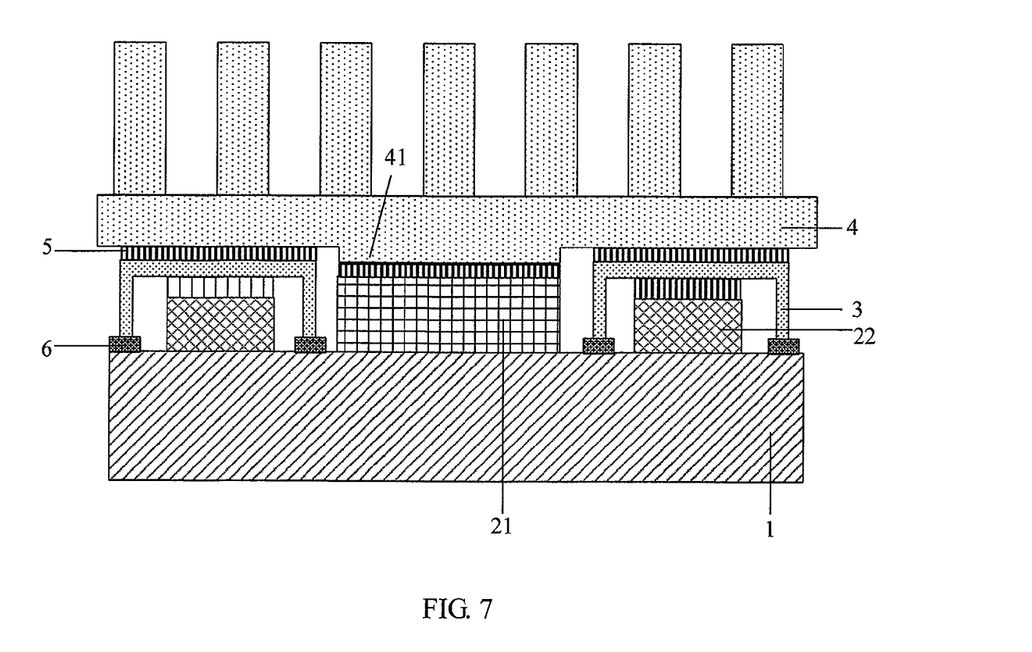
FIG. 7 is a schematic structural diagram of a cross section of another chip package structure according to an embodiment of the present invention.
Figure 8:
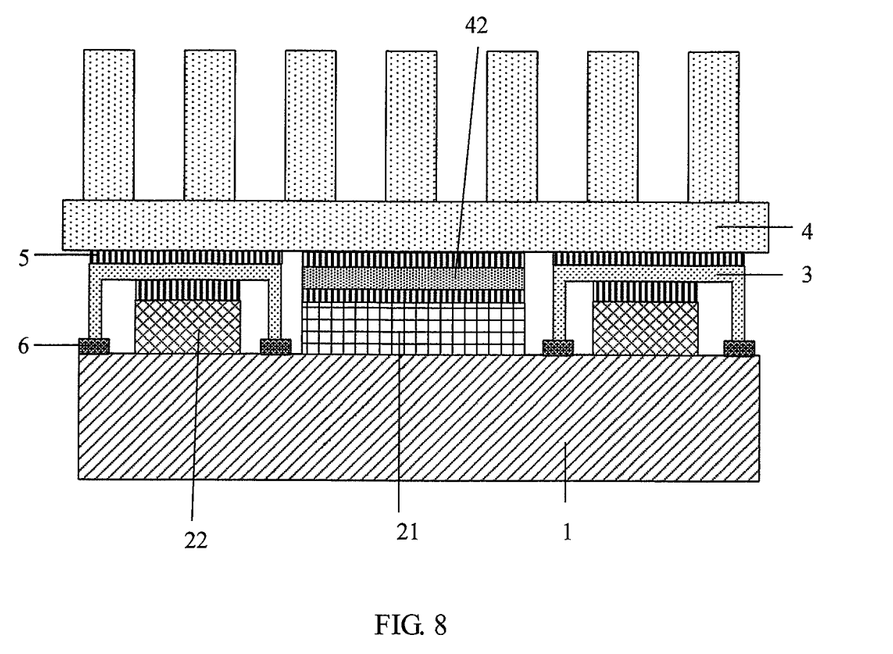
FIG. 8 is a schematic structural diagram of a cross section of still another chip package structure according to an embodiment of the present invention.

Further optionally, as shown in FIGS. 7 and 8, the chip package structure further includes a heat sink 4.

The heat sink 4 is bonded to the at least one master chip 21 by using the heat conducting material 5 on each master chip 21 at the heat dissipating window 31, and is bonded to the heat dissipating lid 3 by using the heat conducting material 5 on the heat dissipating lid 3.

Further, optionally, as shown in FIG. 7, the heat sink 4 further includes a boss structure 41 located inside the heat dissipating window 31 that corresponds to a position of each master chip 21, and each boss structure 41 separately is bonded to the corresponding master chip 21 by using the heat conducting material 5 on each master chip 21.

Further, optionally, as shown in FIG. 8, the chip package structure further includes a heat transfer sheet 42 located at the heat dissipating window 31 between the heat sink 4 and each master chip 21. Each heat transfer sheet 42 is bonded to the heat sink 4 by using the heat conducting material 5 between the heat transfer sheet 42 and the heat sink 4, and each heat transfer sheet 42 is bonded to the corresponding master chip 21 by using the heat conducting material 5 between the heat transfer sheet 42 and the corresponding master chip 21.

The above boss structure and heat transfer sheet are disposed to avoid a height difference between the master chip and the heat dissipating lid, where the height difference results in a gap between the heat sink and the master chip to let air enter when the heat sink is installed, and air is a poor conductor of heat that hinders heat from transmitting from the master chip to the heat sink. Therefore, the boss structure or heat transfer sheet is added between the master chip and the heat sink to eliminate the height difference between the master chip and the heat dissipating lid.

Specifically, as shown in FIG. 7, when the heat sink 4 further includes the boss structure 41 located inside the heat dissipating window 31 corresponding to a position of each master chip 21, the boss structure 41 is directly bonded to the corresponding master chip 21 by using the heat conducting material 5 on each master chip 21; and when the heat sink 4 does not include the boss structure 41, as shown in FIG. 8, the chip package structure further includes the heat transfer sheet 42 located at the heat dissipating window 31 between the heat sink 4 and each master chip 21. The heat transfer sheet 42 is bonded to the corresponding master chip 21 by using the heat conducting material 5 between the heat transfer sheet 42 and the corresponding master chip 21, and is bonded to the heat sink 4 by using the heat conducting material 5 between the heat transfer sheet 42 and the heat sink 4.

Optionally, the heat conducting material 5 mentioned in the embodiments of the present invention is a heat-dissipation interface material. The heat-dissipation interface material is generally a thermally conductive silicone. This kind of heat-dissipation interface material can not only decrease a thermal contact resistance generated between a heat source surface and a contact surface of a heat sink component, but also perfectly fill a gap between the contact surfaces to squeeze air out of the contact surfaces, thereby preventing the air between the contact surfaces (air is a poor conductor of heat) from hindering heat from transmitting between contact surfaces. In addition, with the supplement of the heat-dissipation interface material, the contact between contact surfaces is better, and a real face-to-face contact is achieved. In addition, the heat-dissipation interface material is generally further used as a bonding agent to perform a bonding function between components.

In the chip package structure provided in the embodiments of the present invention, a heat dissipating lid is bonded to a slave chip by using a heat conducting material, a heat dissipating window is opened on the heat dissipating lid at a position corresponding to each master chip, and a heat sink is bonded to the master chip by using a heat conducting material on each master chip at the heat dissipating window and is bonded to the heat dissipating lid by using a heat conducting material on the heat dissipating lid, thereby protecting the chips and effectively dissipating heat for the chips.

Figure 9:
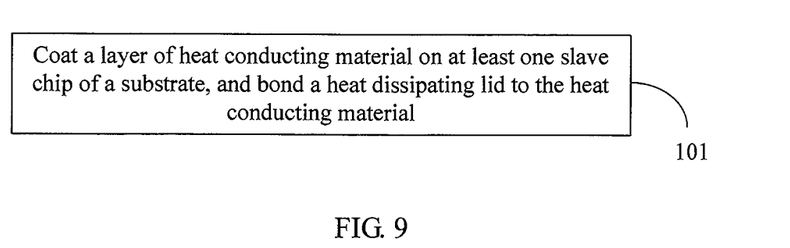
FIG. 9 is a schematic flowchart of a chip packaging method according to an embodiment of the present invention.

An embodiment of the present invention specifically describes a chip packaging method. As shown in FIG. 9, the packaging method includes the following steps:

101: Coat a layer of heat conducting material on at least one slave chip of a substrate, and bond a heat dissipating lid to the at least one slave chip.

A specific bonding process is: firstly coat or place the heat conducting material on the at least one slave chip, bond the heat dissipating lid to the heat conducting material according to orientation, and solidify the heat conducting material after the heat dissipating lid is bonded, where solidification temperature is generally about 150° C., and a solidification duration is generally between half an hour and two hours.

The heat dissipating lid needs to be prepared before step 101, and then the processing in the subsequent step 101 is performed. Materials for preparing the heat dissipating lid need to be determined before the heat dissipating lid is prepared. The materials for preparing the heat dissipating lid include copper, copper alloy or AlSiC aluminum silicon carbide. When the material for preparing the heat dissipating lid is copper or copper alloy, proceed to step a1, and when the material for preparing the heat dissipating lid is AlSiC aluminum silicon carbide, proceed to step b1.

Specifically, a preparation process of the heat dissipating lid is as follows:

a1. Select a copper block of a corresponding size, and mill the copper block into a shape corresponding to the heat dissipating lid;

a2. Mill a heat dissipating window at a position corresponding to a master chip where the heat dissipating lid is not needed; and a3. Plate a nickel layer on the milled heat dissipating lid in an electroplating bath to protect the copper from oxidization.

Or,

The heat dissipating lid is prepared by adopting a casting method, and the specific steps are as follows:

b1. Make a mold that is the same as the heat dissipating lid according to a shape and a size of the heat dissipating lid; and b2. Pour a mixture of aluminum and SiC silicon carbide in the mold in high temperature, cool it to room temperature, and take out the heat dissipating lid.

Further, optionally, if the heat dissipating lid in step 101 further includes a first packaging strip that is located at edges of a periphery of the heat dissipating lid and disposed on the substrate side, step 101 further includes:

101a. Coat a layer of bonding material on the substrate at a position corresponding to the first packaging strip, and bond the first packaging strip of the heat dissipating lid to the substrate.

Further optionally, if the heat dissipating lid in step 101 further includes a second packaging strip that is located on a periphery of the at least one master chip and disposed on the substrate side, step 101 further includes:

101b: Coat a layer of bonding material on the substrate at a position corresponding to the second packaging strip, and bond the second packaging strip of the heat dissipating lid to the substrate.

The above bonding material is mainly used to bond the heat dissipating lid together with the substrate, and may be an epoxy resin bonding agent, low-temperature glass, and another material used for bonding.

Figure 10:
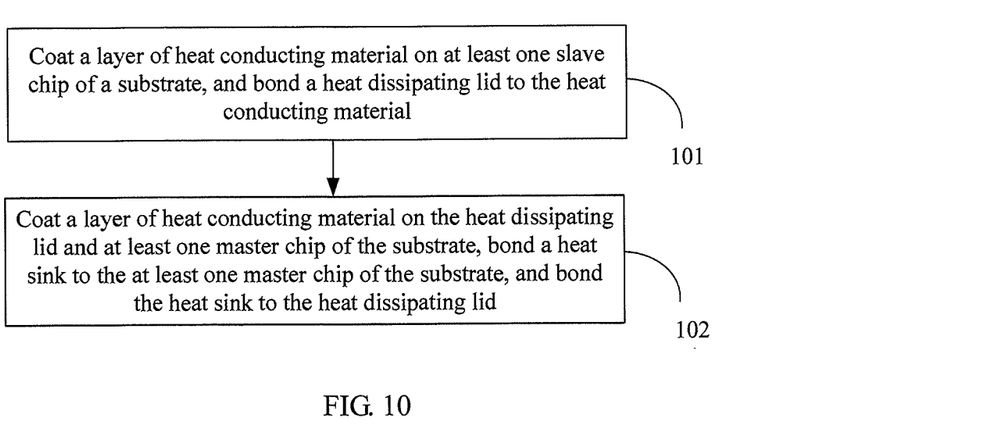
FIG. 10 is a schematic flowchart of another chip packaging method according to an embodiment of the present invention.

Optionally, as shown in FIG. 10, the chip packaging method further includes:

102. Coat a layer of heat conducting material on the heat dissipating lid and at least one master chip of the substrate, bond the heat sink to the at least one master chip of the substrate, and bond the heat sink to the heat dissipating lid.

Specifically, when the heat sink is installed, the heat sink may be bonded by using the heat conducting material, the heat sink may also be installed on the heat dissipating lid in a mechanical fastening manner, for example, using a screw for installation.

In the chip packaging method provided in the embodiments of the present invention, a heat dissipating lid is bonded to a slave chip by using a heat conducting material, a heat dissipating window is opened on the heat dissipating lid at a position corresponding to each master chip, and a heat sink is bonded to the master chip by using a heat conducting material on each master chip at the heat dissipating window and is bonded to the heat dissipating lid by using a heat conducting material on the heat dissipating lid, thereby protecting the chips and effectively dissipating heat for the chips.

Figure 11:
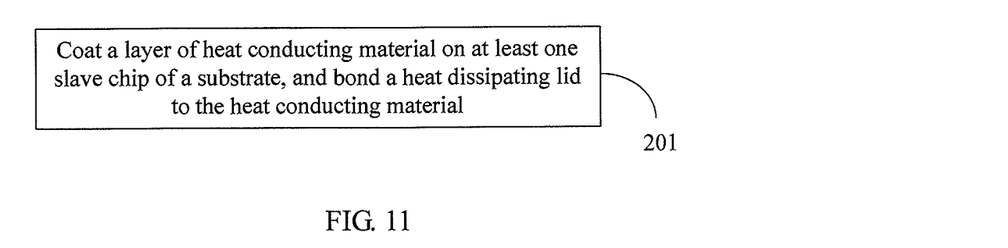
FIG. 11 is a schematic flowchart of a chip packaging method according to another embodiment of the present invention.

The present invention provides another chip packaging method. As shown in FIG. 11, steps of the packaging method are as follows:

201: Coat a layer of heat conducting material on at least one slave chip of a substrate, and bond a heat dissipating lid to the at least one slave chip.

A specific bonding process is: firstly coat or place the heat conducting material on the at least one slave chip, bond the heat dissipating lid to the heat conducting material according to orientation, and solidify the heat conducting material after the heat dissipating lid is bonded, where solidification temperature is generally about 150° C., and a solidification duration is generally between half an hour and two hours. In addition, the heat dissipating lid needs to be prepared before step 201, and the method for preparing the heat dissipating lid is the same as what is described in the preceding embodiment, which is not described herein again.

Further, optionally, if the heat dissipating lid in step 201 further includes a first packaging strip that is located at edges of a periphery of the heat dissipating lid and disposed on the substrate side, step 201 further includes:

201a. Coat a layer of bonding material on the substrate at a position corresponding to the first packaging strip, and bond the first packaging strip of the heat dissipating lid to the substrate.

Further, optionally, if the heat dissipating lid in step 201 further includes a second packaging strip that is located on a periphery of at least one master chip and disposed on the substrate side, step 201 further includes:

201b: Coat a layer of bonding material on the substrate at a position corresponding to the second packaging strip, and bond the second packaging strip of the heat dissipating lid to the substrate.

The above bonding material is mainly used to bond the heat dissipating lid together with the substrate, and may be an epoxy resin bonding agent, low-temperature glass, and another material used for bonding.

Figure 12:
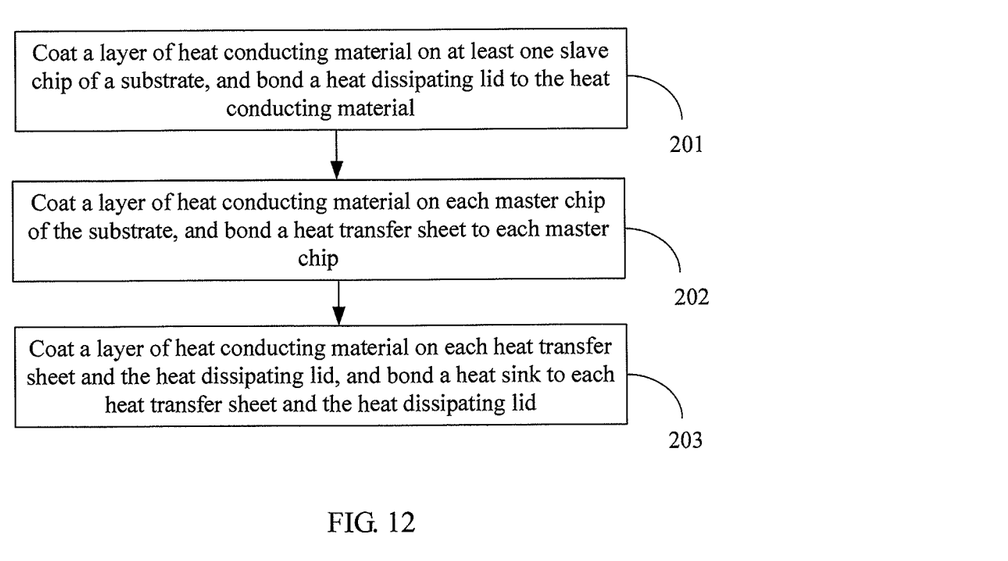
FIG. 12 is a schematic flowchart of another chip packaging method according to another embodiment of the present invention.

Optionally, as shown in FIG. 12, if the chip package structure further includes a heat transfer sheet at the heat dissipating window between the heat sink and each master chip, the chip packaging method further includes step 202 and step 203.

202: Coat a layer of heat conducting material on each master chip of the substrate, and bond the heat transfer sheet to each master chip.

In addition, because there is a heat dissipating window between the master chip and the heat dissipating lid, step 201 and step 202 are not subject to a specific sequence. That is, the heat transfer sheet may be bonded first, or the heat dissipating lid may be bonded first.

203: Coat a layer of heat conducting material on each heat transfer sheet and heat dissipating lid, and bond the heat sink to each heat transfer sheet and the heat dissipating lid.

In the chip packaging method provided in the embodiments of the present invention, a heat dissipating lid is bonded to a slave chip by using a heat conducting material, a heat dissipating window is opened on the heat dissipating lid at a position corresponding to each master chip, and a heat sink is bonded to the master chip by using a heat conducting material on each master chip at the heat dissipating window and is bonded to the heat dissipating lid by using a heat conducting material on the heat dissipating lid, thereby protecting the chips and effectively dissipating heat for the chips.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the appended claims.

What is claimed is:

1. A chip package structure, comprising:
    a substrate;
    at least one master chip disposed on the substrate and a plurality of slave chips disposed on the substrate in a stack;
    a heat dissipating lid bonded to a top one of the plurality of slave chips through a first heat conducting material, and covering the plurality of slave chips, the heat dissipating lid comprising a heat dissipating window at a position corresponding to the at least one master chip; and
    a heat sink comprising a boss structure, the boss structure located within the heat dissipating window and corresponding to a position of the at least one master chip, the heat sink bonded to the at least one master chip via the boss structure through a second heat conducting material on the at least one master chip at the heat dissipating window, and bonded to the heat dissipating lid through a third heat conducting material on the heat dissipating lid;
    wherein the heat dissipating lid comprises a first packaging strip that is located at edges proximal a first edge of a periphery of the heat dissipating lid and disposed on a substrate side, wherein the first packaging strip is bonded to the substrate by using a bonding material;
    a second packaging strip that is located at edges proximal a second edge of the periphery of the heat dissipating lid and disposed on the substrate side, the second packaging strip located between the plurality of slave chips and the master chip, wherein the second packaging strip is bonded to the substrate by using the bonding material.

2. The chip package structure according to claim 1, wherein the chip package structure further comprises a heat transfer sheet that is located at the heat dissipating window between the heat sink and the at least one master chip, wherein the heat transfer sheet is bonded to the heat sink by using through a fourth heat conducting material between the heat transfer sheet and the heat sink, and the heat transfer sheet is bonded to the at least one master chip by using through a fifth heat conducting material between the heat transfer sheet and the at least one master chip.

3. The chip package structure according to claim 1, wherein the chip package structure further comprises a heat transfer sheet that is located at the heat dissipating window between the heat sink and the at least one master chip, wherein the heat transfer sheet is bonded to the heat sink by using through a fourth heat conducting material between the heat transfer sheet and the heat sink, and the heat transfer sheet is bonded to the at least one master chip by using through a fifth heat conducting material between the heat transfer sheet and the at least one master chip.

4. The chip package structure according to claim 1, wherein the chip package structure further comprises a heat transfer sheet that is located at the heat dissipating window between the heat sink and the at least one master chip, wherein the heat transfer sheet is bonded to the heat sink by using through a fourth heat conducting material between the heat transfer sheet and the heat sink, and the heat transfer sheet is bonded to the at least one master chip by using through a fifth heat conducting material between the heat transfer sheet and the at least one master chip.

5. The chip package structure according to claim 1, wherein an area of the heat dissipating window is greater than or equal to an upper surface area of the at least one master chip.

6. The chip package structure according to claim 5, wherein the heat conducting material is a heat-dissipation interface material.

7. A chip packaging method, comprising:
    mounting a master chip on a surface of a substrate;
    mounting a plurality of slave chips in a stack on the surface of the substrate;
    applying a first heat conducting material to a top one of the plurality of slave chips;
    bonding a heat dissipating lid to the top one of the plurality of slave chips through the first heat conducting material;
    forming an opening in the heat dissipating lid at a position corresponding to the master chip;
    applying a second heat conducting material to the master chip at the opening and a third heat conducting material to the heat dissipating lid;
    bonding a heat sink that comprises a boss structure to the master chip via the boss structure through the second heat conducting material, the boss structure located within the opening; and
    bonding the heat sink to the heat dissipating lid through the third heat conducting material;
    wherein the heat dissipating lid comprises a first packaging strip that is located proximal a first edge of a periphery of the heat dissipating lid and disposed on a substrate side, the method further comprising bonding the first packaging strip to the substrate;
    wherein the heat dissipating lid further comprises a second packaging strip that is located at edges proximal a second edge of the periphery of the heat dissipating lid and disposed on the substrate side, the second packaging strip located between the plurality of slave chips and the master chip, the method further comprising bonding the second packaging strip to the substrate.

8. A chip package structure, comprising:
a substrate;
at least one master chip disposed on the substrate and at least one slave chip disposed on the substrate;
a heat dissipating lid bonded to the slave chip through a first heat conducting material, the heat dissipating lid covering the at least one slave chip, the heat dissipating lid comprising a heat dissipating window at a position corresponding to the at least one master chip;
the heat dissipating lid comprising:
    a first packaging strip that is located at edges proximal a first edge of a periphery of the heat dissipating lid and disposed on a substrate side, wherein the first packaging strip is bonded to the substrate by a bonding material; and
    a second packaging strip that is located at edges proximal a second edge of the periphery of the heat dissipating lid and disposed on the substrate side, the second packaging strip located between the slave chip and the master chip, wherein the second packaging strip is bonded to the substrate by the bonding material;
wherein the at least one slave chip comprises a plurality of slave chips disposed on the substrate in a stack, and the heat dissipating lid is bonded to a top one of the plurality of slave chips.

9. The chip package structure according to claim 8, wherein the chip package structure further comprises a heat sink bonded to the at least one master chip through a second heat conducting material on the at least one master chip at the heat dissipating window and bonded to the heat dissipating lid through a third heat conducting material on the heat dissipating lid.

10. The chip package structure according to claim 9, wherein the heat sink further comprises a boss structure located inside the heat dissipating window and corresponding to a position of the at least one master chip, the heat sink bonded to the at least one master chip via the boss structure through the second heat conducting material on the at least one master chip.

11. The chip package structure according to claim 9, wherein the chip package structure further comprises a heat transfer sheet that is located at the heat dissipating window between the heat sink and the at least one master chip, wherein the heat transfer sheet is bonded to the heat sink through a fourth heat conducting material between the heat transfer sheet and the heat sink, and the heat transfer sheet is bonded to the at least one master chip through a fifth heat conducting material between the heat transfer sheet and the at least one master chip.

12. The chip package structure according to claim 8, wherein an area of the heat dissipating window is greater than or equal to an upper surface area of the at least one master chip.

* * * * *